(12) United States Patent
Mei et al.

(10) Patent No.: US 6,864,529 B2
(45) Date of Patent: Mar. 8, 2005

(54) THIN FILM TRANSISTOR MEMORY DEVICE

(75) Inventors: Ping Mei, Palo Alt, CA (US); James R. Eaton, Jr., Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 10 days.

(21) Appl. No.: 09/934,548

(22) Filed: Aug. 23, 2001

(65) Prior Publication Data

US 2003/0045037 A1 Mar. 6, 2003

(51) Int. Cl.[7] .......................................... H01L 29/788
(52) U.S. Cl. .................................................. 257/315
(58) Field of Search ........................................ 257/315

(56) References Cited

U.S. PATENT DOCUMENTS

| | | | |
|---|---|---|---|
| 4,203,158 A | 5/1980 | Frohman-Bentchkowsky et al. ........................... 365/185 |
| 4,387,503 A | 6/1983 | Aswell | |
| 4,939,559 A | * 7/1990 | DiMaria et al. ............. 257/315 |
| 5,360,981 A | 11/1994 | Owen et al. .................... 257/4 |
| 5,517,044 A | 5/1996 | Koyama ...................... 257/316 |
| 5,644,528 A | * 7/1997 | Kojima ..................... 365/185.01 |
| 5,787,042 A | 7/1998 | Morgan ...................... 365/196 |
| 5,817,550 A | 10/1998 | Carey et al. ................. 438/166 |
| 5,818,083 A | 10/1998 | Ito .............................. 257/321 |
| 5,912,840 A | 6/1999 | Gonzalez et al. ...... 365/185.05 |
| 5,981,404 A | 11/1999 | Sheng et al. ................. 438/791 |
| 6,005,270 A | 12/1999 | Noguchi ..................... 257/315 |
| 6,143,582 A | 11/2000 | Vu et al. ....................... 438/30 |
| 6,150,688 A | 11/2000 | Maeda et al. ................ 257/302 |
| 6,177,706 B1 | 1/2001 | Shindo et al. ............... 257/347 |
| 6,222,756 B1 | 4/2001 | Lee ............................. 365/145 |
| 6,225,668 B1 | 5/2001 | Shindo et al. ............... 257/368 |
| 6,226,201 B1 | 5/2001 | Madurawe et al. ..... 365/185.28 |
| 6,229,186 B1 | 5/2001 | Ishida ......................... 257/390 |
| 6,233,194 B1 | 5/2001 | Shubneesh et al. | |
| 6,242,770 B1 | 6/2001 | Bronner et al. ............. 257/295 |
| 6,362,504 B1 | * 3/2002 | Simpson ..................... 257/317 |
| 6,420,752 B1 | * 7/2002 | Ngo et al. ................... 257/315 |

* cited by examiner

*Primary Examiner*—Howard Weiss

(57) ABSTRACT

A memory device includes a memory array of thin film transistor (TFT) memory cells. The memory cells include a floating gate separated from a gate electrode portion of a gate line by an insulator. The gate electrode portion includes a diffusive conductor that diffuses through the insulator under the application of a write voltage. The diffusive conductor forms a conductive path through the insulator that couples the gate line to the floating gate, changing the gate capacitance and therefore the state of the memory cell. The states of the memory cells are detectable as the differing current values for the memory cells. The memory cells are three terminal devices, and read currents do not pass through the conductive paths in the memory cells during read operations. This renders the memory cells robust, because read currents will not interfere with the storage mechanism in the memory cells. The memory array can be fabricated using multiple steps using the same mask. The use of a single mask for multiple steps reduces the time and cost involved in fabricating the memory array.

27 Claims, 9 Drawing Sheets

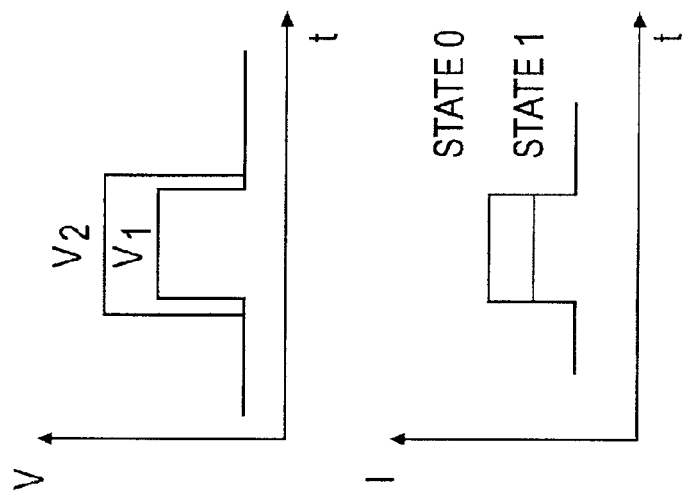
FIG. 7B
FIG. 7C
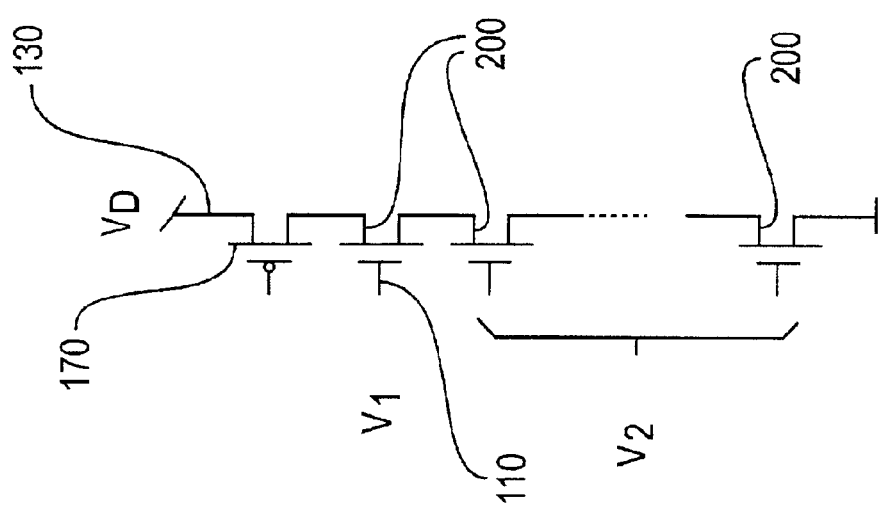
FIG. 7A

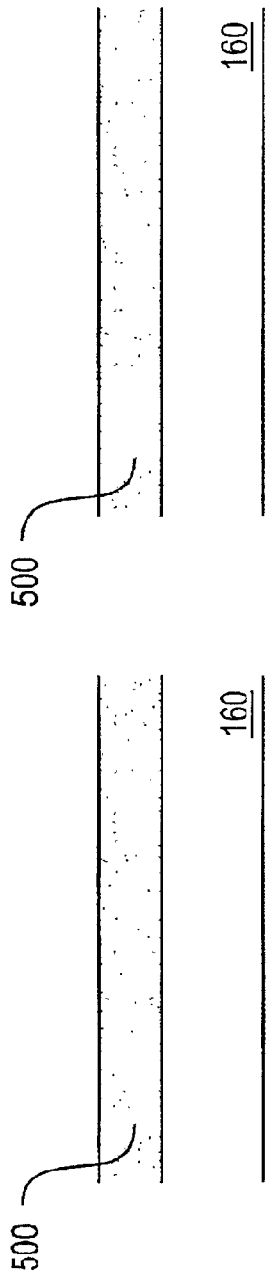
FIG. 9A
FIG. 9B
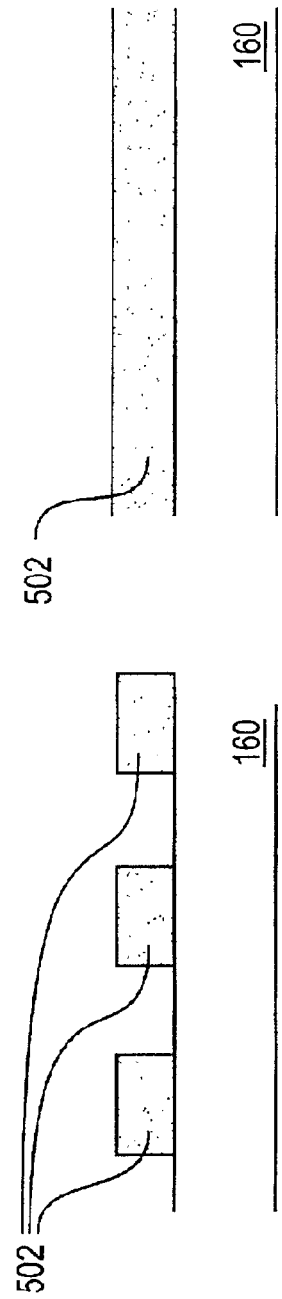
FIG. 10A
FIG. 10B

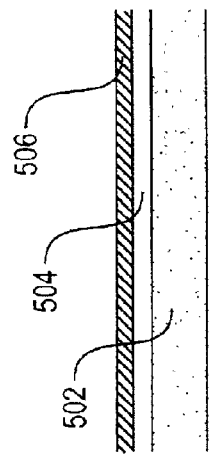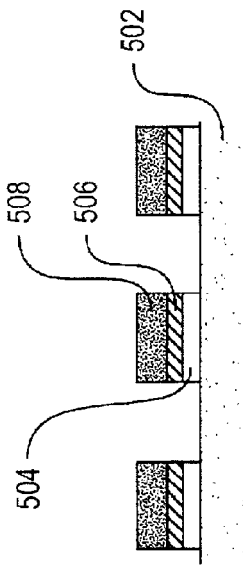
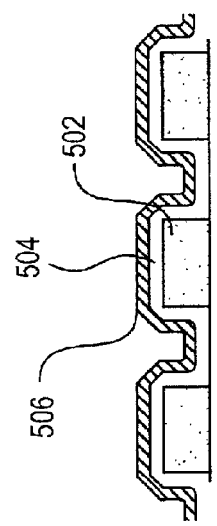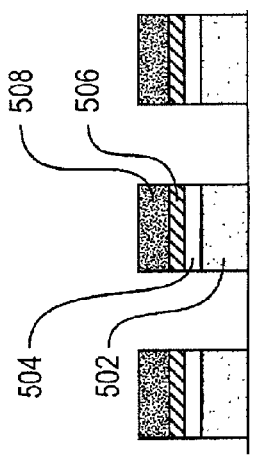
FIG. 11A   FIG. 11B
FIG. 12A   FIG. 12B

THIN FILM TRANSISTOR MEMORY DEVICE

TECHNICAL FIELD

The technical field is cross point memory arrays. More specifically, the technical field is cross point memory arrays having thin film transistor memory cells.

BACKGROUND

The growing popularity of portable electronic devices such as digital cameras and notebook computers has increased demand for inexpensive, high capacity, high performance non-volatile memory.

A conventional example of a non-volatile semiconductor memory suitable for use in portable devices is flash memory. Flash memory is described in U.S. Pat. No. 4,203,158 to Frohman-Bentchkowsky et al. Flash memory utilizes an insulated floating gate to trap and retain charge over long periods of time. The states of flash memory storage elements represent binary states. Conventional flash memory devices, such as the Frohman-Bentchkowsky device, are fabricated on silicon wafers in batch processes. Silicon wafers are expensive, raising the cost of the flash memory devices, and batch processes result in low production rates.

One approach to cost reduction in memory devices is the use of transistor devices fabricated on plastic substrates. Plastic substrates are generally less expensive than crystal silicon wafers. However, low temperature oxides are used to form the floating gate insulator in these devices. Low temperature oxides are used because of the low melt temperature of the plastic substrate. The volatility of low temperature oxides negatively affects long-term charge storage capability.

One approach to the volatility problem is presented in U.S. Pat. No. 5,360,981 to Owen et al. Owen utilizes structural changes in memory cells to represent digital data. Owen's memory cells, however, are two-terminal devices. Two-terminal devices require a read current to pass through a selected memory cell in order to read the selected cell. This is undesirable because the read current may inadvertently alter the state of the selected memory cell. Therefore, two-terminal memory cells may not be robust enough for some applications.

A memory array requires additional circuitry to read and to write to the memory array. The fabrication of the circuitry is preferably compatible with memory array fabrication. In two-terminal memory devices, diodes are integrated into the memory cell to simplify the memory system design, at the expense of more complicated manufacturing processes. Diodes are also integrated into the peripheral addressing circuits to provide manufacturing compatibility with the memory cells. Diode addressing, however, requires high system power in order to achieve high speed operation.

A need therefore exists for an inexpensive memory array having robust memory cells. A need also exists for a memory device capable of high speed operation without consuming excessive power.

SUMMARY

According to a first aspect, a memory device includes a memory array of three terminal thin film transistor (TFT) memory cells. The memory cells are coupled to gate lines and data lines. The memory cells include a floating gate separated from a gate electrode by an insulator. The gate electrode includes a diffusive conductor that diffuses through the insulator under the application of a write voltage. The diffusive conductor forms a conductive path through the insulator that couples the gate line to the floating gate, changing the gate capacitance of the memory cell.

According to the first aspect, the states of the memory cells are detectable as the differing gate capacitance values for the memory cells. The memory cells are three terminal devices, and read currents do not pass through the conductive paths in the memory cells during read operations. This renders the memory cells robust, because read currents do not interfere with the storage mechanism of the memory cells.

According to a second aspect, a method of making a memory array comprises forming semiconductor strips over a substrate, forming an insulator over the strips, forming a gate layer over the insulator, patterning the gate layer and the insulator using a mask, forming source/drains using the mask, and forming gate lines over the insulator.

According to the second aspect, the gate layer and the insulator are patterned using the same mask as is used to form source/drains in the memory array. The use of a single mask reduces the time and cost involved in fabricating the memory array. In addition, the method of making the memory array can include relatively low temperature processes such as sputter deposition and plasma enhanced chemical vapor deposition. Therefore, the substrate can be made from materials having low melt temperatures such as inexpensive glass or plastics.

According to a third aspect, a decoder circuit for the memory device is a NAND decoder circuit used in conjunction with a memory array. The NAND decoder circuit and the memory array can be fabricated monolithically with a memory array using self-aligned fabrication methods.

According to the third aspect, the memory device can have a high density without a high fabrication cost. In addition, the integrated address decoder reduces the number of connections required for the memory array to communicate with external devices, such as drivers. This feature is possible because the integrated address decoder can be coupled to each of the lines in the memory array, and may have a relatively small number of output lines connected to output devices. Also according to the third aspect, when using thin film transistors, the address decoder circuits access the memory cells line-by-line. Therefore, all cells connected to a selected row may be accessed simultaneously. The data rate is therefore much faster than when using single cell access methods.

Also according to the third aspect, the transistor-based address decoder circuit has a low power consumption due to the low power consumption of transistor elements.

Other aspects and advantages will become apparent from the following detailed description, taken in conjunction with the accompanying figures.

DESCRIPTION OF THE FIGURES

The detailed description will refer to the following figures wherein like reference numerals refer to like elements and wherein:

FIG. 7A is a schematic view of a column of the memory array illustrated in FIG. 2;

FIG. 7B illustrates voltages applied in a reading scheme for the memory array illustrated in FIG. 2;

FIG. 7C illustrates currents resulting from the reading scheme illustrated in FIG. 7B;

FIGS. 9–15 illustrate a method of making a thin film transistor memory array.

DETAILED DESCRIPTION

A memory device will be discussed by way of preferred embodiments and by way of the drawings.

Figure 1:
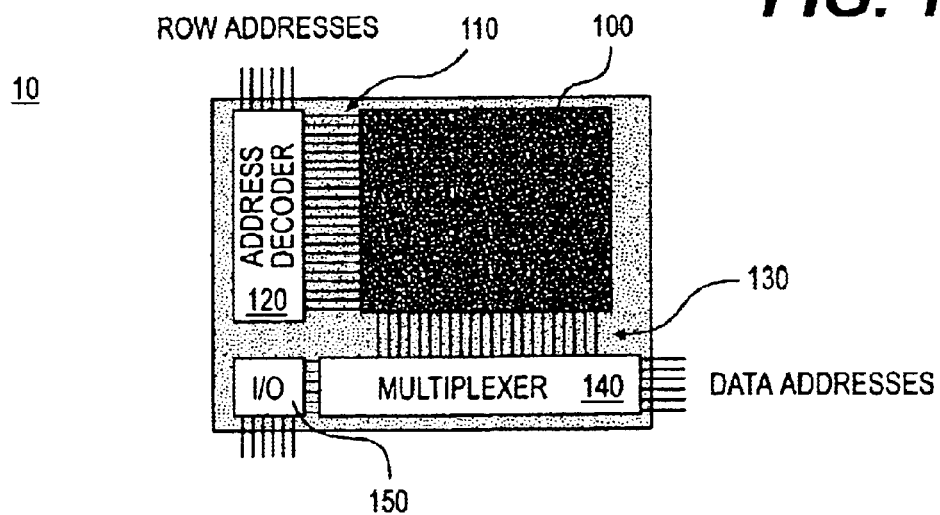
FIG. 1 illustrates a memory device.

FIG. 1 illustrates a memory device 10. The memory device 10 can be, for example, a memory card, and may be based on thin film technology. The memory device 10 includes a memory array 100 of memory cells. The memory array 100 is coupled to a row address decoder 120 and to a multiplexer 140. The multiplexer 140 is coupled to an input/output (I/O) device 150. The memory cells (not shown in FIG. 1) in the memory array 100 can be three terminal devices, such as, for example, thin film transistor (TFT) devices, and other transistor devices.

The memory array 100 stores data in the memory device 10. The address decoder 120 is coupled to gate lines 110 of the memory device 10. The address decoder 120 accesses the row of a selected memory cell 200 according to an address instruction. The multiplexer 140 is coupled to data lines 130 of the memory array 100. The multiplexer 140 combines signals from the data lines 130 and multiplexes the signals to the I/O device 150. The I/O device 150 serves as an input receiver and an output buffer for the memory device 10, and communicates with external devices, such as, for example, drivers.

Figure 2:
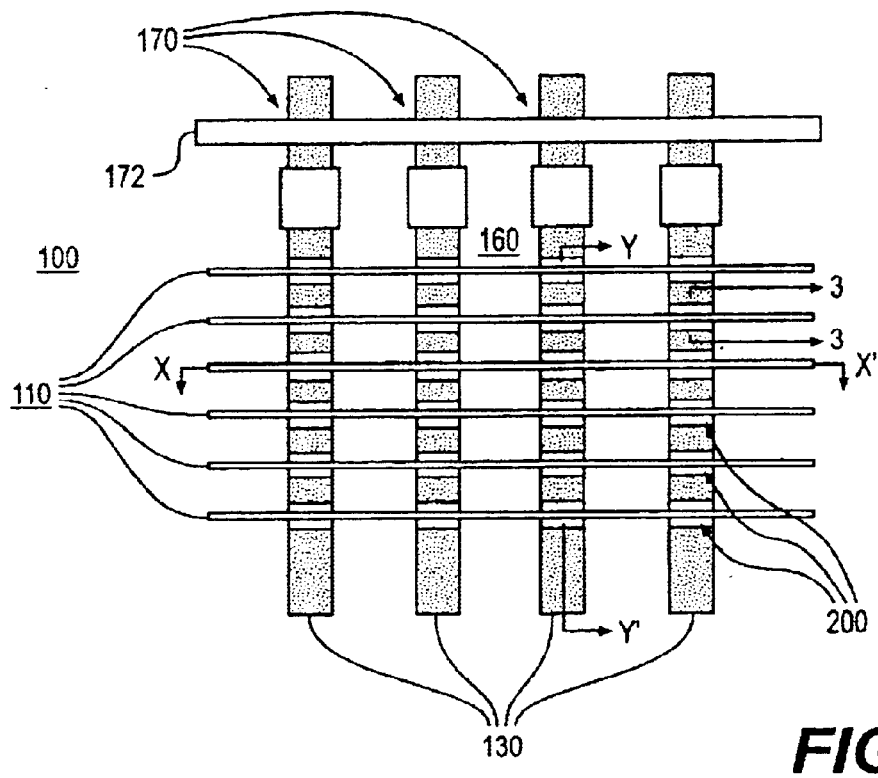
FIG. 2 is a plan view of a thin film transistor memory array for use in the memory device illustrated in FIG. 1.

FIG. 2 is a plan view of the TFT memory array 100 illustrated in FIG. 1. The memory array 100 includes the rows of the gate lines 110, and the columns of the data lines 130. Memory cells 200 are located at the crossing points of the data lines 130 and the gate lines 110. Each data line 130 is coupled to a p-channel thin film transistor 170 controlled by a gate line 172. An exemplary memory cell 200 is discussed in detail with reference to FIGS. 3A and 3B.

In FIG. 2, the memory array 100 includes six gate lines 110 and four data lines 130, intersecting at twenty-four memory cells 200. In practice, any number of gate lines 110, data lines 130, and memory cells 200 can be included in the memory array 100.

The substrate 160 can be, for example, a semiconductor substrate, such as a single crystalline silicon wafer. The single crystalline silicon wafer can include CMOS devices. Alternatively, the substrate 160 can be glass, such as, for example, Corning™ 1737. The substrate 160 can also be a plastic, such as, for example, polymide. Glass and plastic materials can be used to form the substrate 160 because of the relatively low temperature fabrication method used to produce the memory device 10.

The data lines 130 can be thin strips of semiconductor material, such as silicon. The data lines 130 can be deposited as a silicon layer over the substrate 160, which can be subsequently patterned to form the data line 130 strips. The silicon can be an amorphous silicon deposited by, for example, plasma enhanced chemical vapor deposition (PECVD). Alternatively, the silicon strips can be polycrystalline silicon, crystalline silicon, or semiconductors such as SiGe, Ge, SiC, GaAs, and organic semiconductors. The data lines 130 can have a thickness on the order of, for example, 1000 Angstroms. The thickness of the data lines 130 may vary according to the material used to form the data lines 130.

The p-channel TFTs 170 may be used as resistive load elements for the memory array 100. The p-channel TFTs 170 may be synchronized with gate line pulses to the memory cells 200, and provide power savings during idle periods for the memory device 10. The p-channel TFTs 170 can be replaced with, for example, a simple n-channel circuit, or, a resistive circuit.

The structure of the memory cells 200 is discussed in detail with reference to FIGS. 3A and 3B.

Figure 3A:
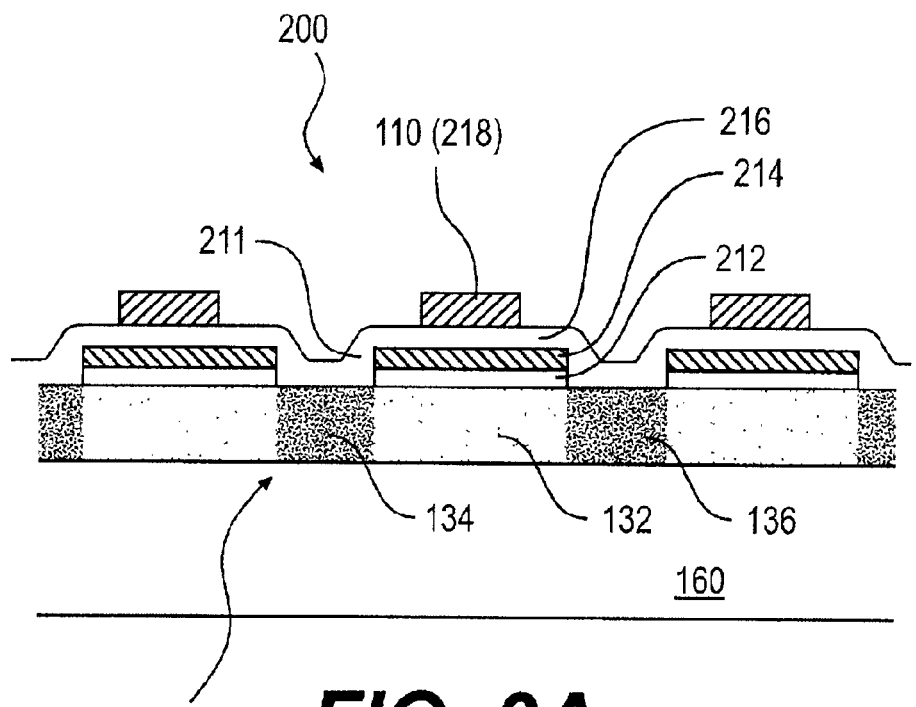
FIG. 3A is a sectional view taken along section line 3—3 in FIG. 2 of a thin film transistor memory cell before a write operation.

FIG. 3A is a sectional view taken along the section line 3—3 in FIG. 2, of a TFT memory cell 200 before a write operation. Neighboring memory cells 200 on the data line 130 are also illustrated. FIG. 3B is a sectional view taken along the section line 3—3 of the memory cell 200, after a write operation.

The memory cell 200 is a three terminal transistor device. The memory cell 200 may be a thin film transistor formed at the intersection of a gate line 110 and a data line 130. The memory array 100 may therefore include a number of memory cells 200 equal to the number of intersections of the gate lines 110 and the data lines 130.

The memory cell 200 comprises a channel region 132 of the data line 130, a source region 134 of the data line 130, a drain region 136 of the data line 130, a gate insulator 211 having a gate insulator layer 212 disposed over the channel region 132 and a gate insulator layer 216 disposed over a floating gate 214, and a gate line 110 extending over the gate insulator 212. The portion of the gate line 110 contacting the gate insulator 216 serves as a gate electrode 218 for the TFT memory cell 200.

The gate insulator layers 212, 216 may be layers of dielectric material. The gate insulators 212, 216 may be separate layers on either side of the floating gate 214, as illustrated in FIGS. 3A and 3B. Alternatively, the gate insulators 212, 216 may be formed as a continuous quantity of dielectric material, with the floating gate 214 embedded within the single layer. The gate insulator layers 212, 216 may be made from, for example, silicon dioxide ($SiO_2$), silicon nitride ($Si_3N_4$), and other dielectrics. The gate insulator 211 isolates the gate electrode 218 from the channel region 132 when a voltage is applied to the gate electrode 218. The gate insulator 211 may be formed by, for example, a deposition-patterning process. The thickness of the gate insulator 211 is selected according to the material used to form the gate insulator 211. For example, an oxide gate insulator may have a thickness on the order of 1000 Angstroms, while a silicon nitride gate insulator may have a thickness on the order of 3000 Angstroms.

The floating gate 214 is made from a conductive material. Examples of materials suitable to form the floating gate 214 include metals such as W, Al, Cr, TiW, and Cu. Alternatively, for example, a doped polysilicon layer, such as a doped polysilicon film, could be used. The floating gate 214 can have a thickness on the order of, for example, 300 Angstroms, and can be formed as a strip by patterning and etching processes.

The gate line 110 (and thus the gate electrode 218) is a conductor including a diffusive metal. A diffusive metal is mobile under an applied electric field, and can diffuse through adjacent materials in the direction of the applied field. Examples of suitable materials for the diffusive metal include silver, vanadium, and other diffusive metals. The gate line 110 can be formed as a strip by patterning and etching processes. The gate line 110 may be re-etched to be narrower than the floating gate 214, as illustrated in FIGS. 3A and 3B.

Figure 3B:
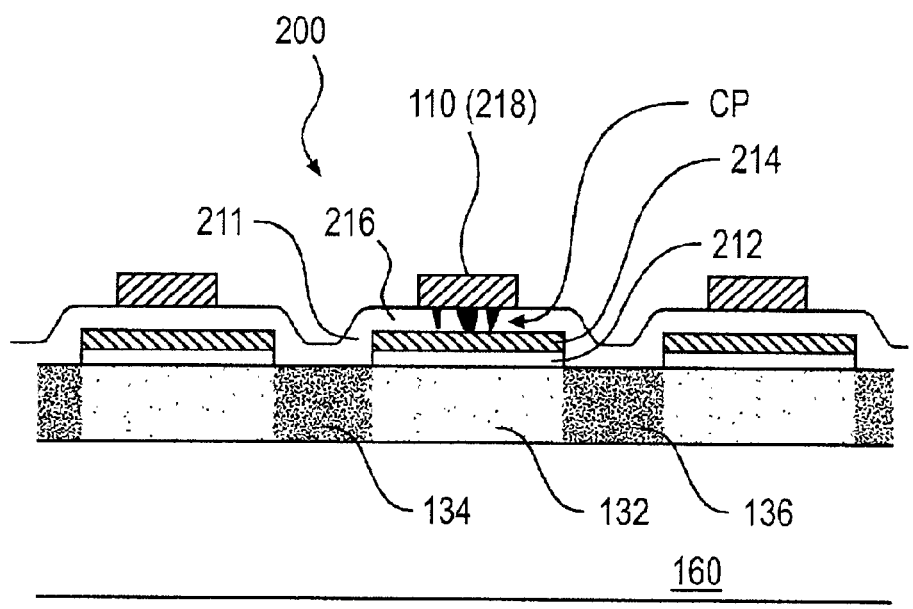
FIG. 3B is a sectional view taken along section line 3—3 in FIG. 2 of a thin film transistor memory cell after a write operation.

The source and drain regions 134, 136 can be formed by doping portions of the data line 130, as illustrated in FIGS. 3A and 3B. Alternatively, sources and drains can be formed by depositing a metal-semiconductor alloy, such as, for example, metallic silicide, over the data line 130. The memory cells 200 are arranged in a line, and the source region 134 of one memory cell 200 serves as the drain region 136 of a neighboring memory cell 200. Similarly, the drain region 136 of a memory cell 200 serves as the source region 134 of a neighboring memory cell 200. Therefore, each source and each drain is actually a source/drain.

According to the embodiment illustrated in FIGS. 3A and 3B, the portion of the gate line 110 extending over the gate insulator 216 serves as the gate electrode 218 for the memory cell 200, which is a transistor. During a write operation, portions of the gate electrode 218 diffuse through the gate insulator 216 to change the gate capacitance of the transistor memory cell 200. The change in gate capacitance of the memory cell 200 changes the transistor current-voltage characteristics of the memory cell 200. The change in current-voltage characteristics can be detected by current readings from the memory cell 200. The read and write functions for the memory cell 200 are discussed in detail below.

The write process for the memory cell 200 will now be discussed in detail with reference to FIGS. 3A, 3B and 4.

Referring to FIG. 3A, before a writing process, the floating gate 214 is isolated in the gate insulator layers 212, 216. In other words, there are no conductive paths between the gate line 110 and the floating gate 214. This state is illustrated by FIG. 3A. In this state, the gate-to-channel capacitance, or gate capacitance $C_g$ is:

$$C_g = \frac{\varepsilon_0}{\frac{d_1}{\varepsilon_1 A_1} + \frac{d_2}{\varepsilon_2 A_2}}$$

where, $\varepsilon_0$ is the electromagnetic permittivity of a vacuum, $\varepsilon_1$ is the electromagnetic permittivity of the insulator layer 216, $\varepsilon_2$ is the electromagnetic permittivity of the insulator layer 212, $A_1$ is the area of the gate electrode 218, $A_2$ is the area of the floating gate 214, $d_1$ is the thickness of the insulator layer 216 above the floating gate 214, and $d_2$ is the thickness of the insulator layer 212 below the floating gate 214.

In this state, the memory cell 200 has a relatively low gate capacitance $C_g$. The low gate capacitance state of the memory cell 200 before writing can correspond to a binary state of "0" for the memory cell 200. This convention, however, is arbitrary, and the assignment of the binary state of "0" can be reassigned to "1," or any other symbolic value.

FIG. 3B illustrates the memory cell 200 after a write operation. After a write operation, the bit in the memory cell 200 can be arbitrarily assigned the binary value of "1," or any other symbolic value. The memory cell 200 is written to by applying a driving source potential, such as a high gate voltage, across the memory cell 200. The high gate voltage causes conductive elements or portions of the gate electrode 218 to diffuse to the floating gate 214. The diffused elements create conductive paths CP as they diffuse through the gate insulator layer 216.

The floating gate 214 acts as a diffusion barrier to prevent the diffused metal from the gate electrode 218 from diffusing into the gate insulator layer 212 below the floating gate 214.

After the write operation, the floating gate 214 is electrically coupled to the gate electrode 218 (and the gate line 110) along the conductive paths CP. This coupling changes the gate capacitance $C_g$ of the memory cell 200. The gate capacitance $C_g$ is now determined according to the distance $d_2$ and the area $A_2$, by the formula:

$$C_g = \frac{\varepsilon_0 \varepsilon_2 A_2}{d_2}.$$

The gate capacitance $C_g$ therefore increases after the write operation. The change of the gate capacitance $C_g$ is reflected in the transistor transfer characteristics, or source-drain current versus gate voltage (I-V) characteristics of the memory cell 200. The I-V characteristics of the memory cells 200 can be detected by, for example, current readings at selected source-drain and gate voltages.

According to the embodiment illustrated in FIGS. 3A and 3B, the memory cells 200 in the memory array 100 are capable of storing two binary states. The binary states are detectable as a change in the gate capacitance $C_g$ of the memory cells 200.

Figure 4:
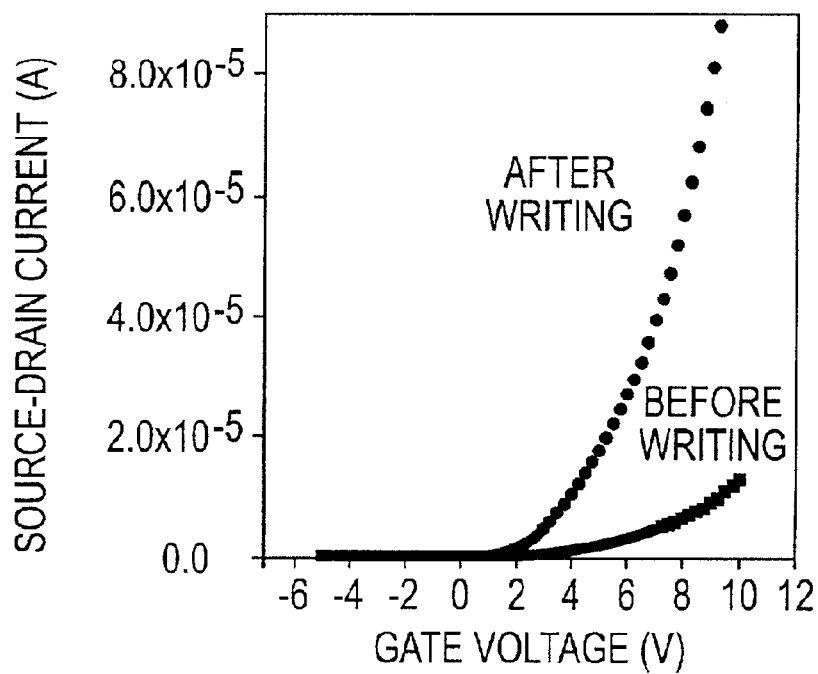
FIG. 4 illustrates a transfer characteristic for a thin film transistor memory cell.

FIG. 4 illustrates a transfer characteristic for the TFT memory cell 200 illustrated in FIGS. 3A and 3B, before and after a write operation.

The data points illustrated in FIG. 4 represent simulated I-V characteristics of an exemplary memory cell 200. The I-V curve is derived using an aim-spice model and experimental data from polysilicon TFTs.

In the example, the memory cell 200 is a 1 µm×1 µm memory cell with a gate line 110 width of 0.5 µm. The floating gate 214 is located 20 nm above the channel region 132. The transfer curve is under a source-drain voltage of 3 V. The source-drain current ratio before and after writing is about 1:9, over a gate voltage value of about 1 V. The current ratios in the memory cells 200 are sufficient to distinguish between the states of the memory cells 200 during a read operation.

Figure 5:
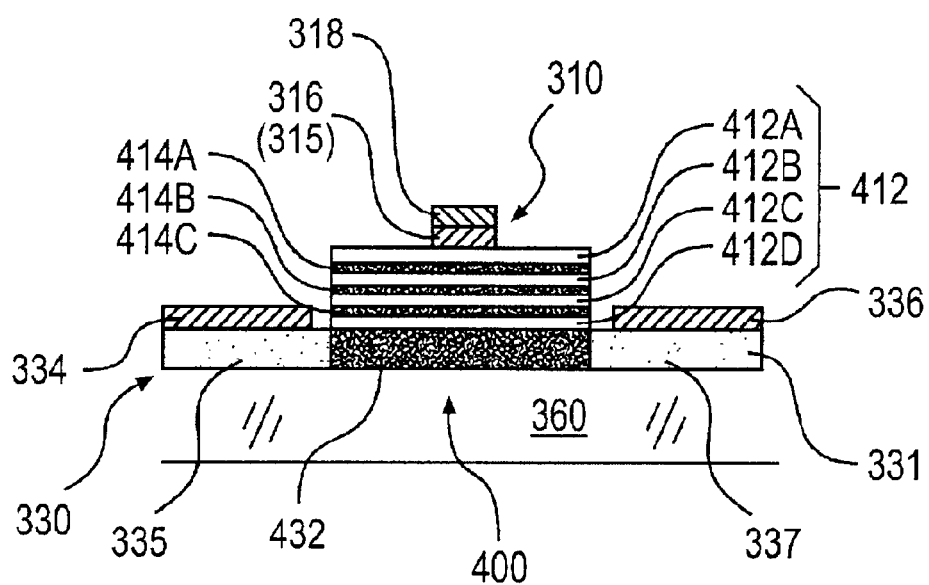
FIG. 5 is a sectional view of an alternative embodiment of a thin film transistor memory cell.

FIG. 5 is a sectional view of an alternative embodiment of a TFT memory cell 400. The TFT memory cell 400 has multiple layers of gate insulator and floating gates. The memory cell 400 is capable of storing one of four different memory states, or bits. A plurality of memory cells 400 can be included in a memory device, such as in the memory device 10 illustrated in FIG. 1.

The memory cell 400 is a thin film transistor formed at the intersection of a gate line 310 and a data line 330. A memory device (not illustrated) could include a number of memory cells 400 equal to the number of intersections of gate lines 310 and data lines 330.

The portion of the data line 330 of the embodiment illustrated in FIG. 5 comprises a semiconductor strip 331, a source electrode 334 disposed over a source contact region 335, a channel region 432, and a drain electrode 336 disposed over a drain contact region 337. The transistor memory cell 400 comprises the source and drain electrode and contact regions, a gate insulator 412 comprising layers 412A, 412B, 412C, 412D, floating gates 414A, 414B, 414C, and a gate electrode portion 315 of the gate line 310 extending over the gate insulator layer 412A. The gate electrode 315 portion of the gate line 310 contacting the gate insulator layer 412A serves as the gate electrode for the TFT memory cell 400. In the memory cell 400, the source and drain electrodes 334, 336 may be formed by depositing a metal-semiconductor alloy, such as, for example, metallic silicide, over the semiconductor strip 331.

The gate line 310 can comprise a layer 316 l of diffusive metal and a layer 318 of conductive metal. The conductive layer 318 can be made from, for example, aluminum or copper. Advantageously, the conductive layer 318 can be non-diffusive, or less diffusive, than the layer 316 of diffusive metal. The conductive layer 318 can therefore serve as a stable bus line for the memory array 100. The gate lines 110 in the memory device 10 (FIG. 3A) may have a similar bimetallic configuration.

The memory cell 400 includes four gate insulator layers 412A, 412B, 412C, 412D, each of which can be diffused by conductive elements of a diffuse metal. Each of the layers 412A, 412B, 412C, 412D can be a layer of dielectric material, and each layer can have a different dielectric constant. The use of insulating layers of differing dielectric constants provides flexibility in choosing metal diffusion length and gate capacitance $C_g$ in the memory cell 400. The areas of the layers 412A, 412B, 412C, 412D may also be varied. In general, a number n+1 of bit states of can be stored in a memory cell, where n is the number of floating gates in the memory cell. In the memory cell 400, four bit states can be stored because the memory cell 400 includes three floating gates 414A, 414B, 414C.

Each of the four different bit states can be created in the memory cell 400 by applying a selected one of four different write voltages across the memory cell 400. The diffusive metals of each of the floating gates 414A, 414B, 414C can be selected to diffuse through an adjacent layer of dielectric material under a different voltage.

A bi-metallic gate line similar to the gate line 310 can be included in the memory array 100 having memory cells 200. Alternatively, the electrodes can be individually patterned over each memory cell 200, 400, beneath a gate line. The electrodes need not extend the full length of the gate lines.

A write operation for the memory array 100 will now be discussed with reference to FIG. 6.

Figure 6:
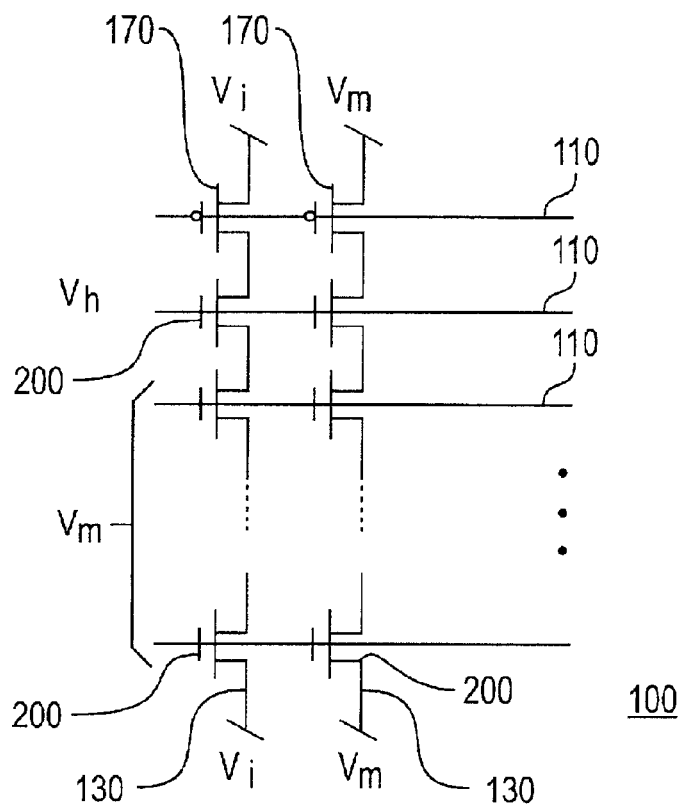
FIG. 6 illustrates a writing scheme for the memory array illustrated in FIG. 2.

FIG. 6 illustrates a method of writing to a memory cell 200 in the thin film transistor memory array 100. In FIG. 6, the memory cells 200 are illustrated schematically as transistors. There are three characteristic voltages, $V_l$, $V_m$, and $V_h$, used in the write scheme.

In order to write to a selected memory cell 200, a high gate voltage, $V_h$, is applied to the gate line 110 that intersects the selected memory cell 200. An intermediate voltage, $V_m$, is applied to all other, unselected gate lines 110. At the same time, a low data voltage $V_l$ is applied to both ends of the data line 130 intersecting the selected memory cell 200. The intermediate voltage $V_m$ is applied to both ends of all other, unselected data lines 130.

At the selected memory cell 200, the high gate voltage $V_h$ relative to the low source and drain voltage $V_l$ (i.e., $V_h-V_l$) results in a high voltage field across the selected memory cell 200. The high voltage $V_h-V_l$ drives diffusion of conductive elements from the gate electrode 218 through the gate insulator 216, electrically connecting the gate electrode 218 (and the gate line 110) to the floating gate 214. The coupling of the gate line 110 to the floating gate 214 changes the gate capacitance $C_g$ of the memory cell 200, which is detectable by a read operation.

The voltage $V_h-V_m$ across unselected memory cells 200 on the selected gate line 110 is selected to be insufficient to diffuse gate electrodes 218 of unselected memory cells 200. Similarly, the intermediate voltage $V_m$ is insufficient to cause diffusion of gate electrodes 218 of unselected memory cells 200.

In order to write to the four-bit memory cell 400 illustrated in FIG. 5, four different voltages can be applied as $V_h$ in order to obtain selective diffusion of the three different diffusive metal layers 414A, 414B, 414C. For example, if $V_m$=5 V, and $V_l$=0 V, $V_h$ may vary between 7, 8, 9 and 10 V to achieve the four bit states of the memory cell 400. Other values for the voltages $V_l$, $V_m$, and $V_h$ can be used to obtain four bit states in the memory cell 400, depending upon the geometry of and the materials comprising the memory cell 400.

A read operation for the memory array 100 will now be discussed with reference to FIGS. 7A–7C.

FIG. 7A is a schematic view of a column of the memory array 100 illustrated in FIG. 2, including the memory cells 200 coupled to a data line 130 extending along the column. In FIG. 7A, the memory cells 200 are illustrated symbolically as transistors. FIG. 7B illustrates the voltages applied in a reading scheme for a memory cell 200 in the memory array 100. FIG. 7C illustrates the currents resulting from the reading scheme for the memory array 100.

Referring to FIG. 7A, in each column of the memory array 100, the TFT memory cells 200 are connected in series. To read a selected memory cell 200, an intermediate voltage $V_1$ is applied to the gate electrode (i.e., the gate line 110 intersecting the selected memory cell 200) of the selected memory cell 200. At the same time, a high gate voltage $V_2$ is applied to all other memory cells 200 cells on the column. As illustrated by FIG. 7B.

The state of the bit of the selected memory cell 200 is detectable by detecting the current through the selected data line 130. For example, a high current I through the data line 130 can indicate a binary state of "0," and a low current I through the selected data line 130 can represent a binary state of "1." These states are illustrated by FIG. 7C. The assignment of the binary values "0" and "1" is arbitrary, however, and the values may be reassigned depending upon the desired application for the memory array 100.

The p-channel TFTs 170 act as resistive load elements. The p-channel TFTs 170 may be synchronized with gate pulses on the gate lines 110 to provide power savings during idle periods of the memory array 100.

The read operation example discussed above is addressed to a logical NAND arrangement of memory cells 200. Other arrangements are possible, such as, for example, a NOR configuration, where the memory cells are connected in parallel to a load. The memory cell 400 illustrated in FIG. 5 can be read in a manner similar to that of the memory cell 200.

According to the above embodiments, the states of the memory cells 200 and 400 are detectable as different gate capacitance $C_g$ values for the memory cells 200. The memory cells 200 are three terminal devices, so the read current does not pass through the conductive paths CP during read operations. The memory cells 200, 400 are therefore more robust, because read currents do not interfere with the storage mechanism in the memory cells 200, 400.

Figure 8:
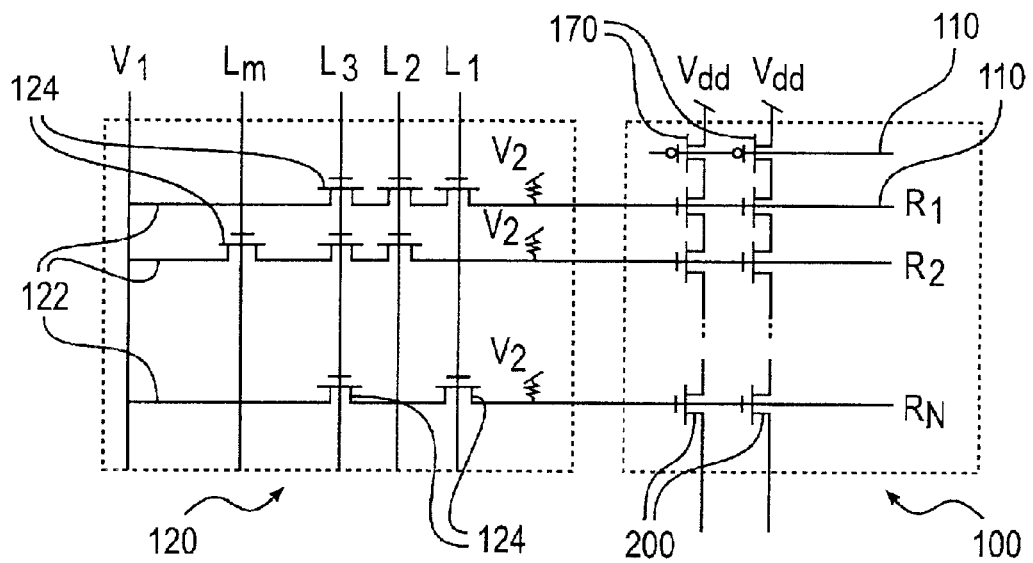
FIG. 8 illustrates an address decoder for the memory device illustrated in FIG. 1.

FIG. 8 is a schematic diagram of the address decoder 120 illustrated in FIG. 1. The address decoder 120 is illustrated as a NAND gate decoder circuit. The address decoder 120 addresses the gate lines 110 of the memory array 100.

The address decoder 120 includes address lines, $L_1$, $L_2$, ... $L_M$ one address line for each gate line 110 of the memory array 100. The address lines $L_1, L_2, \ldots L_M$ are each coupled to the gate lines 110 along lines 122 through one or more transistors 124. The transistors 124 can be, for example, n-channel transistors. $V_1$ and $V_2$ are bias voltages.

A combination of signals are applied to the address lines, $L_1, L_2, \ldots L_M$ in order to address a memory cell 200. For example, to read the first row line $R_1$, corresponding to the first gate line 110 in the memory array 100, a positive pulse is applied to the address lines $L_1$, $L_2$, and $L_3$. The positive pulse turns ON all the n-channel transistors 124 on the address lines $L_1$, $L_2$, $L_3$. The voltage on row line $R_1$ in the memory array is held at a voltage $V_1$. Under this condition, the lower voltage $V_1$ is applied to the gate electrode on row line $R_1$ and the higher voltage $V_2$ is applied to the other row lines $R_2$–$R_N$.

The relationship between the number M of address lines $L_1, L_2, \ldots L_M$ and the number N of row lines $R_1, R_2, \ldots R_N$ is expressed by:

$$N = \frac{M!}{N_T!(M - N_T)!}$$

where $N_T$ is the number of the transistors on each row address line. A similar circuit may be also used for a data line decoder for the memory device 10.

An advantage of using the NAND decoder circuit 120 as illustrated in FIG. 8 is that the decoder circuit 120 can be fabricated monolithically with the TFT memory array 100. The manufacture of the memory array 100 and the decoder circuit 120 can be performed without via etching, and may include self-aligned TFT fabrication. The manufacture of the decoder circuit 120 is therefore compatible with the memory array 100. Use of a self-aligned process enables a high density array with a low fabrication cost. Also, because the decoder circuit 120 is manufactured using transistor devices, the decoder circuit 120 can operate at high speeds with relatively low power requirements.

As a further advantage, all of the memory cells that are connected to the selected row can be accessed simultaneously. This allows high speed parallel reading of and writing to the memory array.

FIGS. 9–15 illustrate a method of making a thin film transistor memory array. The construction of the memory array is described with reference to a memory cell and neighboring cells. This method can be used to fabricate the memory array 100, including memory cells 200, as illustrated in FIGS. 2, 3A and 3B.

FIGS. 9A, 10A, 11A, 12A, 13A, 14A and 15A illustrate cross sectional views of the various stages of fabrication of a memory cell 200, as seen from the section line Y–Y' in FIG. 2. FIGS. 9B, 10B, 11B, 12B, 13B, 14B and 15B illustrate cross sectional views of the various stages of fabrication of a memory cell 200, as seen from the section line X–X' in FIG. 2.

Referring to FIGS. 9A and 9B, the fabrication process begins with providing a substrate 160. The substrate 160 can be, for example, a semiconductor substrate, such as a single crystalline silicon wafer. The single crystalline silicon wafer can include CMOS devices. Alternatively, the substrate 160 can be glass, such as, for example, Corning™ 1737. The substrate 160 can also be plastic, such as, for example, polymide. Glass and plastic materials can be used to form the substrate 160 because of the relatively low temperature fabrication methods used to produce the memory device 10.

A semiconductor layer 500 is deposited over the substrate 160. The semiconductor layer 500 can be, for example, an amorphous silicon deposited by, for example, PECVD. The amorphous silicon can be converted to polycrystalline silicon by a laser or by thermal crystallization. The silicon can also be deposited as polycrystalline silicon. Alternatively, the silicon strips can be, for example, crystalline silicon, semiconductors such as SiGe, Ge, SiC, GaAs, and organic semiconductors. The semiconductor layer 500 can have a thickness on the order of, for example, 1000 Angstroms.

Referring to FIGS. 10 and 10B, the semiconductor layer 500 is patterned to form strips 502 extending along columns of the memory array being fabricated. The semiconductor layer 500 can be patterned using a photolithographic mask/etch process.

Referring to FIGS. 11A and 11B, a dielectric layer 504 is deposited over the substrate 160 and the strips 502. The dielectric layer 504 may be, for example, silicon dioxide ($SiO_2$), silicon nitride ($Si_3N_4$), and other dielectrics. The deposition process may be, for example, CVD, PECVD, and other deposition processes. The thickness of the dielectric layer 504 is selected according to the material used to form the dielectric layer 504. For example, an oxide dielectric layer 504 may have a thickness on the order of, for example, 1000 Angstroms, while a silicon nitride dielectric layer 504 may have a thickness on the order of, for example, 3000 Angstroms.

After depositing the dielectric layer 504, a gate layer 506 is deposited over the dielectric layer 504. The gate layer 506 may be, for example, a floating gate layer. The gate layer 506 can be a conductive material. Examples of materials suitable to form the gate layer 506 include metals such as W, Al, Cr, TiW, and Cu. Alternatively, a doped polysilicon layer, such as a doped polysilicon film, could be used. The gate layer 506 can have a thickness on the order of, for example, 300 Angstroms. The gate layer 506 can be deposited by, for example, DC or RF sputter deposition processes, and other deposition processes.

Referring to FIGS. 12A and 12B, the dielectric layer 504 and the gate layer 506 are patterned. During patterning, a photoresist mask layer 508 is placed over the gate layer 506. The gate layer 506 and the dielectric layer 504 are then etched. The etchant chemical does not etch the strips 502 or the substrate 160.

Figure 13A:
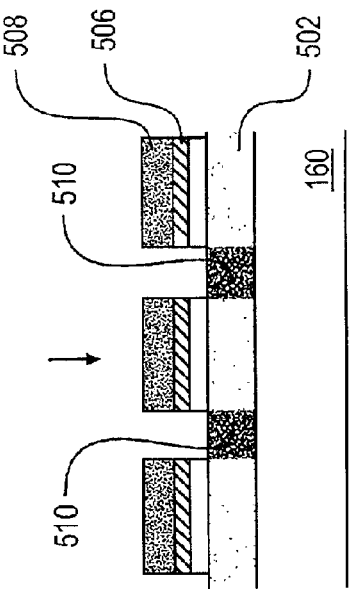
Figure 13B:
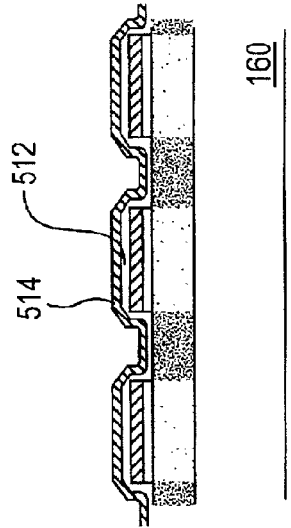

Referring to FIGS. 13A and 13B, regions 510 of the semiconductor strip 502 between the dielectric layer 504 are doped to form source/drains in the semiconductor strip 502. The doped regions 510 will act as the source and drain regions in the completed memory array. A doped region located between two memory cells serves as a source region for one memory cell and a drain region for an adjacent memory cell. The doping process can include processes such as laser doping, thermal annealing, or ion implantation. In the doping process, the photoresist mask layer 508 used to etch the gate layer 506 and the dielectric layer 504 (FIGS. 12A and 12B) also serves as a doping mask.

The source/drains may also formed by depositing a conductor over the semiconductor strips 502, as in the memory cell 400 illustrated in FIG. 5. This process may require a separate mask to form the conductors.

Figure 14A:
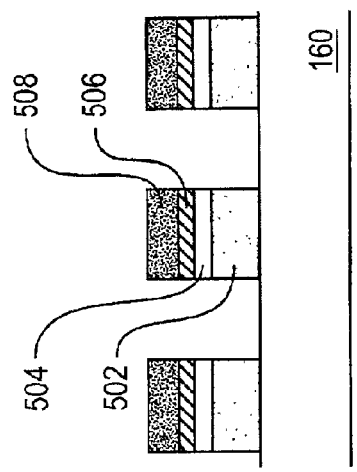
Figure 14B:
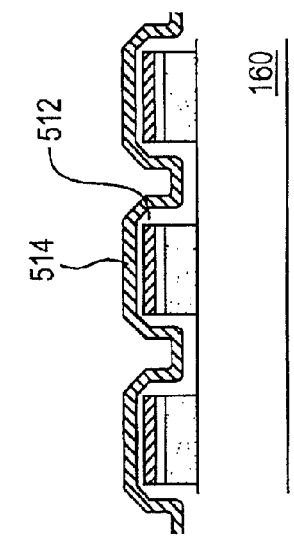

Referring to FIGS. 14A and 14B, the photoresist mask 508 is removed. A dielectric layer 512 is then deposited over the memory array. The dielectric layer 512 may be made from materials such as those used to form the dielectric layer 504. The dielectric layer 512 can be deposited by, for example, CVD, PECVD, and other deposition processes.

A diffuse metal layer 514 is next deposited over the dielectric layer 512. The diffuse metal layer 514 may be, for example, silver, vanadium, and other diffusive metals. The diffuse metal layer 514 can be deposited by, for example, DC or RF sputter deposition processes, and other deposition processes.

Figure 15B:
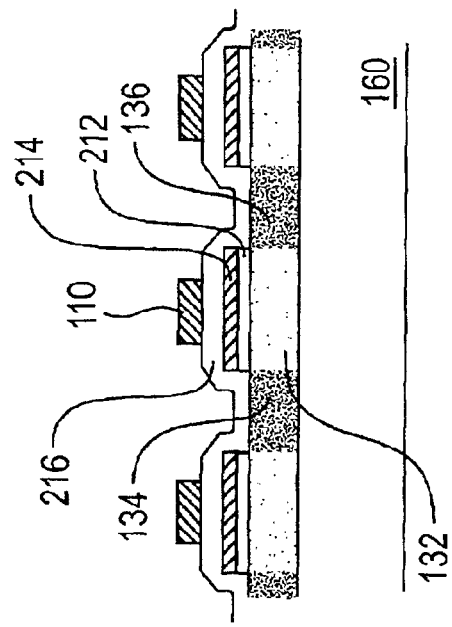
Figure 15A:
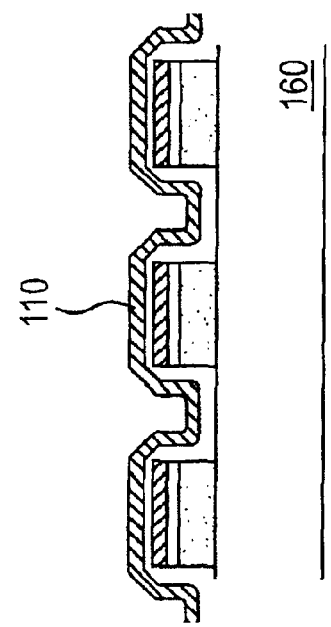

Referring to FIGS. 15A and 15B, the diffuse metal layer 514 is patterned to form gate lines 110. The diffuse metal layer 514 can be patterned as strips by patterning and etching processes. FIGS. 15A and 15B illustrate a completed portion of a memory array including memory cells 200 as illustrated in FIGS. 3A and 3B. The gate line 110 may be re-etched to be smaller than the floating gate 214.

The memory cell 400 illustrated in FIG. 5 may be fabricated in a manner similar to the method recited above. In this case, multiple deposition processes are required to form the alternating floating gate/dielectric layers in the memory cell 400. A two-step deposition process is also required to form the bimetallic gate line 310.

According to the above method, the gate layer 506 and the insulator 540 may be patterned using the same mask 508 as is used to form source/drains in the memory array 100. The use of a single mask reduces the time and cost involved in fabricating the memory array 100.

In addition, the memory array 100 may be fabricated using relatively low temperature processes, such as PECVD processes and sputter depositions. This allows the use of inexpensive glass or plastic substrates 160.

In the memory device 10, the classification of the lines 110 and 130 as columns and rows, respectively, is arbitrary. The classification as columns and rows can be reassigned depending on the application of the memory device 10.

The memory device 10 can be used in a wide variety of applications. One application may be a computing device having storage modules. The storage modules may include one or more memory devices 10 for long term storage, and can be used in devices such as laptop computers, personal computers, and servers.

While the memory device 10 is described with reference to exemplary embodiments, many modifications will be readily apparent to those skilled in the art, and the present disclosure is intended to cover variations thereof.

What is claimed is:

1. A memory cell comprising:
a diffusive metal gate electrode;
at least one floating gate;
a gate insulator including a first gate insulator layer disposed between the at least one floating gate and the diffusive metal gate electrode, and a second gate insulator disposed below and coupled to the first gate insulator layer;
a channel region coupled to the gate insulator;
a source coupled to the channel region;
a drain coupled to the channel region; and
a diffused metal path including diffusive metal from the gate electrode connecting the diffusive metal gate electrode to the at least one floating gate through the first gate insulator layer in response to the application of a write voltage to the gate electrode.

2. The memory cell of claim 1, wherein the channel region, the source and the drain are parts of a continuous layer of semiconductor material.

3. The memory cell of claim 2, wherein the source and drain are doped regions of the layer of semiconductor material.

4. The memory cell of claim 1, wherein the at least one floating gate comprises a plurality of floating gates, and wherein the gate insulator comprises a plurality of gate insulator layers extending between the floating gates.

5. The memory cell of claim 1, wherein the at least one floating gate comprises a metal selected from the group consisting of W, Al, Cr, TiW, and Cu.

6. The memory cell of claim 1, wherein the diffused metal path is formed by the diffusion of conductive elements from the diffusive metal gate electrode through the gate insulator in response to a write voltage applied to the diffusive metal gate electrode.

7. The memory cell of claim 6, wherein the diffused metal path is broken by the diffusion of conductive elements towards the diffusive metal gate electrode in response to a reversal of the write voltage applied to the diffusive metal gate electrode.

8. The memory cell of claim 1, wherein the at least one floating gate is adapted to prevent the conductive elements from the diffusive metal gate electrode from diffusing into the second gate insulator layer.

9. A memory array, comprising:
a substrate;
a plurality of gates lines disposed over the substrate;
a plurality of data lines crossing the gate lines and disposed over the substrate; and
a plurality of memory cells at crossing points of the gate lines and the data lines, each memory cell being coupled to a gate line and a data line that cross at the memory cell, wherein a memory cell comprises:
a diffusive metal gate electrode;
at least one floating gate;
a gate insulator including a first gate insulator layer disposed between the at least one floating gate and the diffusive metal gate electrode, and a second gate insulator disposed below and coupled to the first gate insulator layer;
a channel region coupled to the gate insulator;
a source coupled to the channel region;
a drain coupled to the channel region; and
a diffused metal path including diffusive metal from the gate electrode connecting the diffusive metal gate electrode to the at least one floating gate through the first gate insulator layer in response to the application of a write voltage to the gate electrode.

10. The memory array of claim 9, wherein the data lines comprise strips of semiconductor material, the sources and the drains comprising doped regions of the data lines.

11. The memory array of claim 9, wherein the gate insulator extends between the diffusive metal gate electrode and the floating gate, and between the floating gate and the channel region.

12. The memory array of claim 9, wherein the gate lines are conductive lines coupled to the memory cells, the diffusive metal gate electrode comprising a part of a gate line.

13. The memory array of claim 9, wherein the at least one floating gate comprises a plurality of floating gates, the gate insulator extending between the floating gates.

14. The memory array of claim 9, wherein the gate lines comprise: a first conductor disposed over the gate insulator; and a second conductor coupled to the first conductor.

15. The memory array of claim 14, wherein the first conductor includes a diffusive metal disposed between the insulator and the second conductor.

16. The memory array of claim 9, wherein the substrate comprises at least one of a glass or a plastic.

17. The memory cell of claim 9, wherein the diffused metal path is formed by the diffusion of conductive elements from the diffusive metal gate electrode through the gate insulator in response to a write voltage applied to the diffusive metal gate electrode.

18. The memory cell of claim 17, wherein the diffused metal path is broken by the diffusion of conductive elements towards the diffusive metal gate electrode in response to a reversal of the write voltage applied to the diffusive metal gate electrode.

19. The memory cell of claim 9, wherein the at least one floating gate is adapted to prevent the conductive elements from the diffusive metal gate electrode from diffusing into the second gate insulator layer.

20. A memory cell, comprising:
   a diffusive metal gate electrode;
   at least one floating gate;
   a gate insulator disposed between the at least one floating gate and the diffusive metal gate electrode, the gate insulator comprising a low temperature oxide;
   a diffused metal path including diffusive metal from the gate electrode within the gate insulator and connecting the diffusive metal gate electrode to the at least one floating gate in response to the application of a write voltage to the gate electrode;
   a channel region coupled to the gate insulator;
   a source coupled to the channel region; and
   a drain coupled to the channel region.

21. The memory cell of claim 20, wherein the channel region, the source, and the drain are parts of a continuous layer of semiconductor material.

22. The memory cell of claim 21, wherein the source and drain are doped regions of the layer of semiconductor material.

23. The memory cell of claim 20, wherein the gate insulator extends between the diffusive metal gate electrode and the at least one floating gate and the channel region.

24. The memory cell of claim 23, wherein the at least one floating gate is adapted to prevent the conductive elements from the diffusive metal gate electrode from diffusing into the gate insulator between the at least one floating gate and the channel region.

25. The memory cell of claim 20, wherein the at least one floating gate comprises a plurality of floating gates, the gate insulator extending between the floating gates.

26. The memory cell of claim 20, wherein the diffused metal path is formed by the diffusion of conductive elements from the diffusive metal gate electrode through the gate insulator in response to a write voltage applied to the diffusive metal gate electrode.

27. The memory cell of claim 26, wherein the diffused metal path is broken by the diffusion of conductive elements towards the diffusive metal gate electrode in response to a reversal of the write voltage applied to the diffusive metal gate electrode.

* * * * *